US010468550B2

(12) United States Patent
Lin et al.

(10) Patent No.: US 10,468,550 B2
(45) Date of Patent: Nov. 5, 2019

(54) LIGHT-EMITING DIODE DEVICE AND METHOD OF PRODUCING THE SAME

(71) Applicant: Xiamen Changelight Co. Ltd., Xiamen (CN)

(72) Inventors: Zhiwei Lin, Xiamen (CN); Kaixuan Chen, Xiamen (CN); Junxian Li, Xiamen (CN); Xiangjing Zhuo, Xiamen (CN); Qilong Wu, Xiamen (CN)

(73) Assignee: XIAMEN CHANGELIGHT CO., LTD., Xiamen (CN)

( * ) Notice: Subject to any disclaimer, the term of this patent is extended or adjusted under 35 U.S.C. 154(b) by 0 days.

(21) Appl. No.: 16/220,264

(22) Filed: Dec. 14, 2018

(65) Prior Publication Data
US 2019/0221709 A1    Jul. 18, 2019

(30) Foreign Application Priority Data

Jan. 12, 2018   (CN) .......................... 2018 1 0029288

(51) Int. Cl.
*H01L 33/00*   (2010.01)
*H01L 33/14*   (2010.01)
(Continued)

(52) U.S. Cl.
CPC .......... *H01L 33/145* (2013.01); *H01L 33/005* (2013.01); *H01L 33/382* (2013.01); *H01L 33/62* (2013.01); *H01L 2933/0066* (2013.01)

(58) Field of Classification Search
CPC ........... H01L 2933/0066; H01L 33/005; H01L 33/145; H01L 33/382; H01L 33/62
(Continued)

(56) References Cited

U.S. PATENT DOCUMENTS

2009/0065900 A1   3/2009 Saito
2010/0096641 A1   4/2010 Hwang
(Continued)

FOREIGN PATENT DOCUMENTS

CN    102074629 A    5/2011
CN    205752221 U    11/2016
(Continued)

OTHER PUBLICATIONS

International Search Report and Written Opinion issued in PCT/IB2018/060139, dated Apr. 28, 2019, 7 pages.

*Primary Examiner* — Long K Tran
(74) *Attorney, Agent, or Firm* — Arch & Lake LLP

(57) ABSTRACT

A light-emitting diode (LED) device and a method of producing the same are provided. The LED device comprises a first conductive layer, a second conductive layer, an active layer sandwiched between the first conductive layer and the second conductive layer and a first electrode in electrical contact with the first conductive layer. The first conductive layer has a laminate structure comprising a first conductive sub-layer, a current blocking layer, and a second conductive sub-layer. The first electrode comprises a first extended electrode in electrical contact with the first conductive sub-layer, and a second extended electrode in electrical contact with the second conductive sub-layer. The first conductive sub-layer and the second conductive sub-layer may have different depths.

20 Claims, 8 Drawing Sheets

(51) Int. Cl.
    *H01L 33/38*     (2010.01)
    *H01L 33/62*     (2010.01)

(58) Field of Classification Search
    USPC .......................................................... 257/79
    See application file for complete search history.

(56) References Cited

U.S. PATENT DOCUMENTS

| | | |
|---|---|---|
| 2012/0228580 A1 | 9/2012 | Wang |
| 2013/0001584 A1 | 1/2013 | Sato |
| 2015/0236210 A1 | 8/2015 | Kim |
| 2017/0033268 A1* | 2/2017 | Lee ................. H01L 33/44 |
| 2017/0047483 A1* | 2/2017 | Kim ................. H01L 33/20 |

FOREIGN PATENT DOCUMENTS

| | | |
|---|---|---|
| CN | 107464864 A | 12/2017 |
| CN | 108565320 A | 9/2018 |

\* cited by examiner

LIGHT-EMITING DIODE DEVICE AND METHOD OF PRODUCING THE SAME

CROSS REFERENCE TO RELATED APPLICATION

This application claims benefits of Chinese Patent Applications No. 201810029288.3, filed on Jan. 12, 2018 in the State Intellectual Property Office of China, the disclosure of which is incorporated herein by reference in its entirety.

TECHNICAL FIELD

The present disclosure relates to semiconductor technology, particularly to a light-emitting diode (LED) device and the method of producing the same.

BACKGROUND

LEDs are core components of LED lamps. LEDs have been widely used in various areas in accord with the rapid development of the LED technology. The demand of high power has caused the size of LED chips to become larger. However, large LED chips have poor current spreading effect, and therefore requiring structure optimization. At present, the conventional large size LEDs have adopted the structure of multi-electrode extension, so that the current can spread throughout the large LED chips.

FIG. 1 is the top view of a GaN-based LED adopting the structure of multi-electrode extension. As shown in FIG. 1, either a first electrode or a second electrode of the LED comprises electrode contact points (11, 21) and a plurality of extended electrodes (12, 22). The extended electrodes of the first electrode and the extended electrodes of the second electrode are arranged in an interlaced arrangement.

FIG. 2 is the cross-sectional view along line AA of the LED device in FIG. 1. As shown in FIG. 2, reference 10 indicates the first electrode, reference 13 indicates an insulating structure, reference 20 indicates a second electrode, reference 30 indicates a substrate, reference 40 indicates a buffer layer, reference 50 indicates an unintentional doped layer, reference 60 indicates a first conductive layer, reference 70 indicates an active layer, reference 80 indicates a second conductive layer, and reference 90 indicates a transparent conductive layer. Referring to FIG. 2, the extended electrode of the first electrode 10, through the epitaxial structure of the LED, extends to the first conductive layer 60, and therefore allowing the extended electrode of the first electrode 10 to electrically contact the first conductive layer 60. The insulating structure 13 is attached in the sidewall of the extended electrode of the first electrode 10, preventing the sidewall of the extended electrode of the first electrode from contacting the epitaxial structure.

FIG. 3 is the schematic view of the current extension of the LED device in FIG. 2. For the LED with same-side electrode structure, the current easily gets crowded in the region of dashed box indicated in FIG. 3 when the extended electrode of the first electrode 10 carries large current, and therefore reducing the current spreading effect.

SUMMARY

Therefore, the present disclosure provides an LED device and a method for producing the same which can minimize current crowding and widely spread the current of the LED device.

According to one aspect of the present disclosure, there is provided an LED device, comprising: a first conductive layer, a second conductive layer, an active layer sandwiched between the first conductive layer and the second conductive layer, and a first electrode in electrical contact with the first conductive layer; wherein the first conductive layer has a laminate structure comprising a first conductive sub-layer, a current blocking layer, and a second conductive sub-layer; wherein the first electrode comprises a first extended electrode in electrical contact with the first conductive sub-layer; and a second extended electrode in electrical contact with the second conductive sub-layer.

According to another aspect of the present disclosure, there is provided a method for producing an LED device, comprising forming a first conductive layer, forming an active layer on the first conductive layer, forming a second conductive layer on the active layer, and forming a first electrode in electrical contact with the first conductive layer; wherein the first conductive layer has a laminate structure comprising a first conductive sub-layer, a current blocking layer, and a second conductive sub-layer; wherein the first electrode comprises a first extended electrode in electrical contact with the first conductive sub-layer, and a second extended electrode in electrical contact with the second conductive sub-layer.

According to another aspect of the present disclosure, there is provided an LED device, comprising a first conductive layer, a second conductive layer, an active layer sandwiched between the first conductive layer and the second conductive layer, and a first electrode in electrical contact with the first conductive layer; wherein the first conductive layer comprises a first conductive sub-layer and a second conductive sub-layer at different depths; wherein the first electrode comprises a first extended electrode in electrical contact with the first conductive sub-layer at a first depth, and a second extended electrode in electrical contact with the second conductive sub-layer at a second depth. The difference in depth and conductivity between different conductive sub-layers, together with a certain capacity of current blocking effect, can effectively drive the current from the first extended electrode to horizontally spread to a wider range. Therefore, this aspect of the present disclosure can reasonably distribute the current flow between the first extended electrode and the second extended electrode adj acent to each other, minimize the current crowding, and improve the lighting efficiency of the LED.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate examples consistent with the invention and, together with the description, serve to explain the principles of the invention.

DETAILED DESCRIPTION

Hereinafter, embodiments of the present disclosure will be described in conjunction with the accompanying drawings, rather than to limit the present disclosure. Variations of structure, method, or function made by one ordinary skilled in the art based on these examples are all covered in the scope of the present disclosure.

The terms used in present disclosure are merely directed to illustrate the particular examples, rather than limit to the present disclosure. The singular forms "a" "an" and "the" as used in the present disclosure as well as the appended claims also refer to plural forms unless other meanings are definitely contained in the context. It should be appreciated that the term "and/or" as used herein refers to any or all possible combinations of one or more associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "another embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in another embodiment," or the like in the singular or plural in various places throughout this specification do not necessarily all refer to the same embodiment. Furthermore, the particular features, structures, or characteristics in one or more embodiments may be included or combined in any suitable manner.

Some embodiments of the present disclosure will be described in detail with reference to the accompanying drawings. In the case of no conflict, the following embodiments and the features in the embodiments may be combined with each other.

Figure 1:
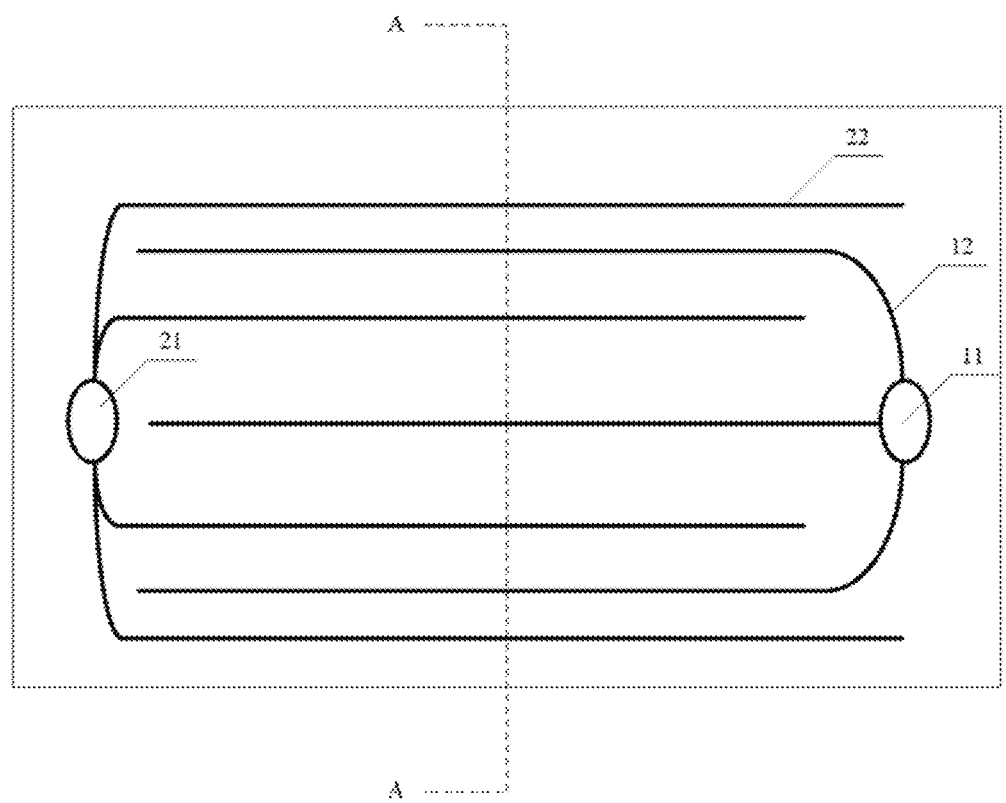
FIG. 1 is the top view of an LED device in the prior art.
Figure 2:
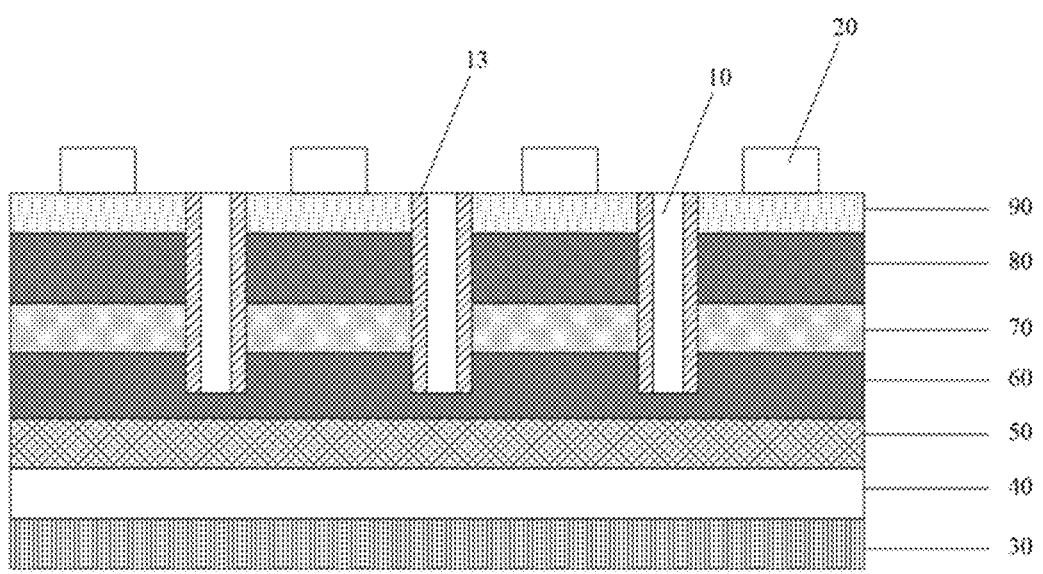
FIG. 2 is the cross-sectional view along line AA of the LED device in FIG. 1.
Figure 3:
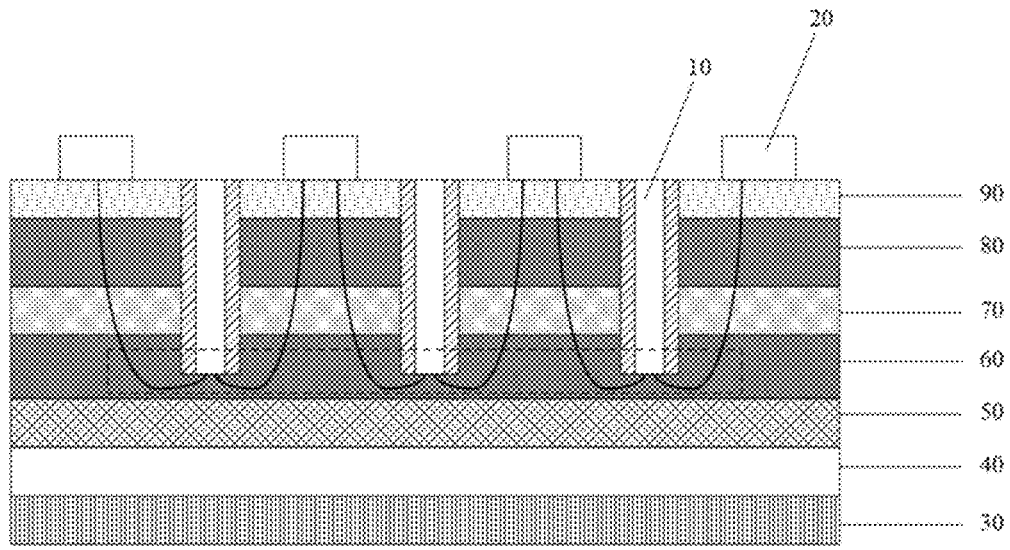
FIG. 3 is the schematic view of the current extension of the LED device in FIG. 2.
Figure 4:
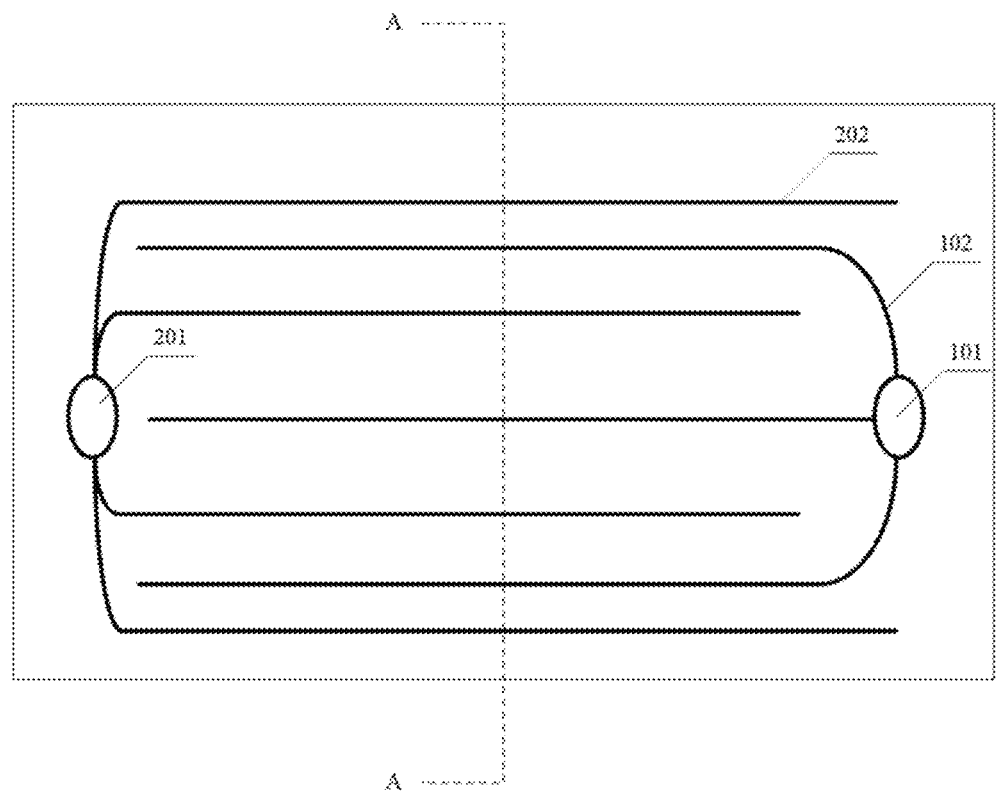
FIG. 4 is the top view of an LED device according to one aspect of the present disclosure.
Figure 5:
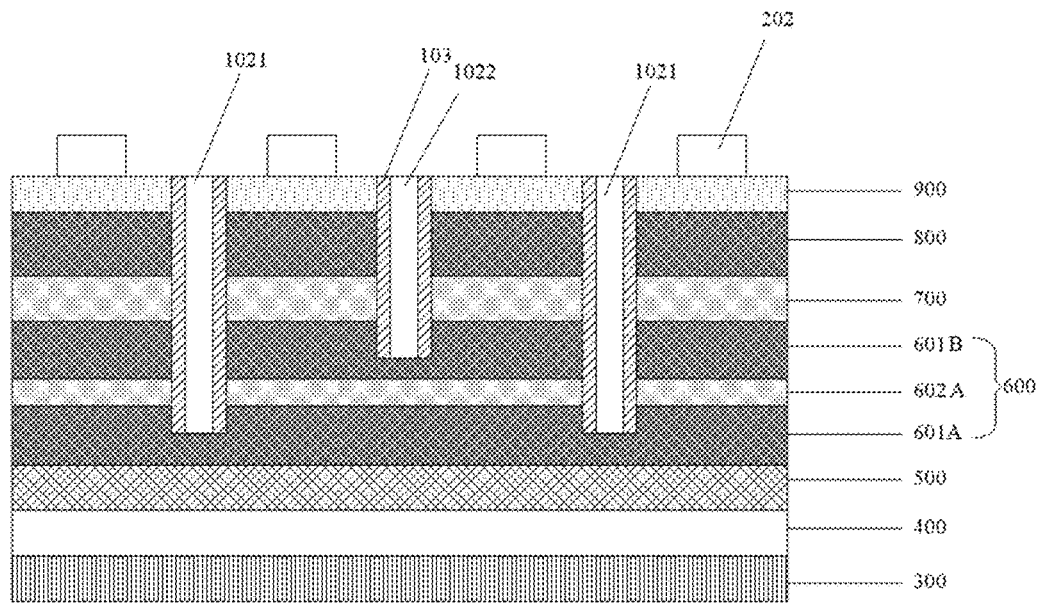
FIG. 5 is the cross-sectional view along line AA of the LED device in FIG. 4.

An LED device in accordance with the present disclosure will be introduced and detailed with reference to FIGS. 4-10. In one aspect of the present disclosure, as shown in FIGS. 4 and 5, the LED device comprises a first conductive layer 600, a second conductive layer 800, an active layer 700 sandwiched between the first conductive layer 600 and the second conductive layer 800, and a first electrode 102 which is in electrical contact with the first conductive layer 600. The first conductive layer 600 has a laminate structure comprising a first conductive sub-layer 601A, a current blocking layer 602A, and a second conductive sub-layer 601B. The first electrode 102 comprises a first extended electrode 1021 which is in electrical contact with the first conductive sub-layer 601A and a second extended electrode 1022 which is in electrical contact with the second conductive sub-layer 601B.

Figure 7:
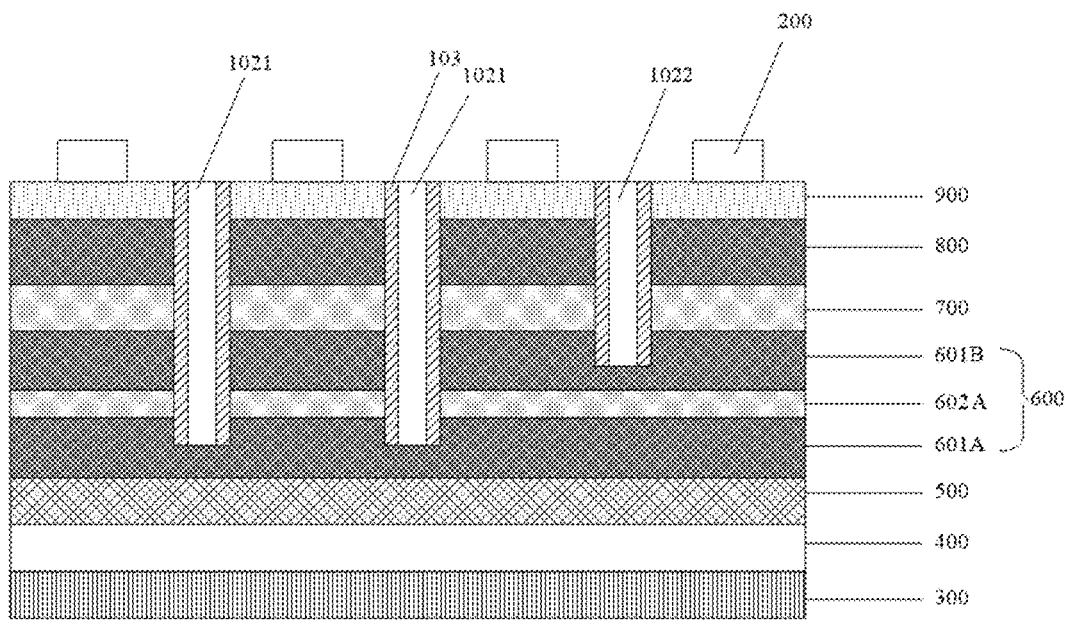
FIG. 7 is the cross-sectional view of an LED device according to another aspect of the present disclosure.

The LED device may further comprise a plurality of the first extended electrodes 1021 and a plurality of the second extended electrodes 1022. The first extended electrodes 1021 and the second extended electrodes 1022 may be arranged in an interlaced arrangement as shown in FIG. 5. Alternatively, the first extended electrodes 1021 may be arranged in an adjacent arrangement as shown in FIG. 7. The numbers of the first extended electrodes 1021 and the second extended electrodes 1022 are not limited to the indication in the aspect shown in FIG. 5. There will be at least one extended electrode in electrical contact with each conductive sub-layer.

The first conductive layer 600 may further comprise a first channel extending through the second conductive sub-layer 601B and the current blocking layer 602A, allowing the first extended electrode 1021 to electrically contact the first conductive sub-layer 601A. Alternatively or additionally, the first channel extends partially into the first conductive sub-layer 601A.

The first conductive layer 600 may further comprise an insulating structure for insulating the first extended electrode 1021 from the second conductive sub-layer 601B and the current blocking layer 602A.

The first channel may further extend through the active layer 700 and the second conductive layer 800, and having an opening on the second conductive layer 800.

The first conductive layer 600 may further comprises a second channel which allows the second extended electrode 1022 to electrically contact the second conductive sub-layer 601B. Alternatively or additionally, the second channel extends partially into the second conductive sub-layer 601B.

The LED device may further comprise a substrate 300, a buffer layer 400, and an unintentional doped layer 500, which are sequentially formed, and the first conductive layer 600 is subsequently formed thereon, as shown in FIG. 5.

Figure 8:
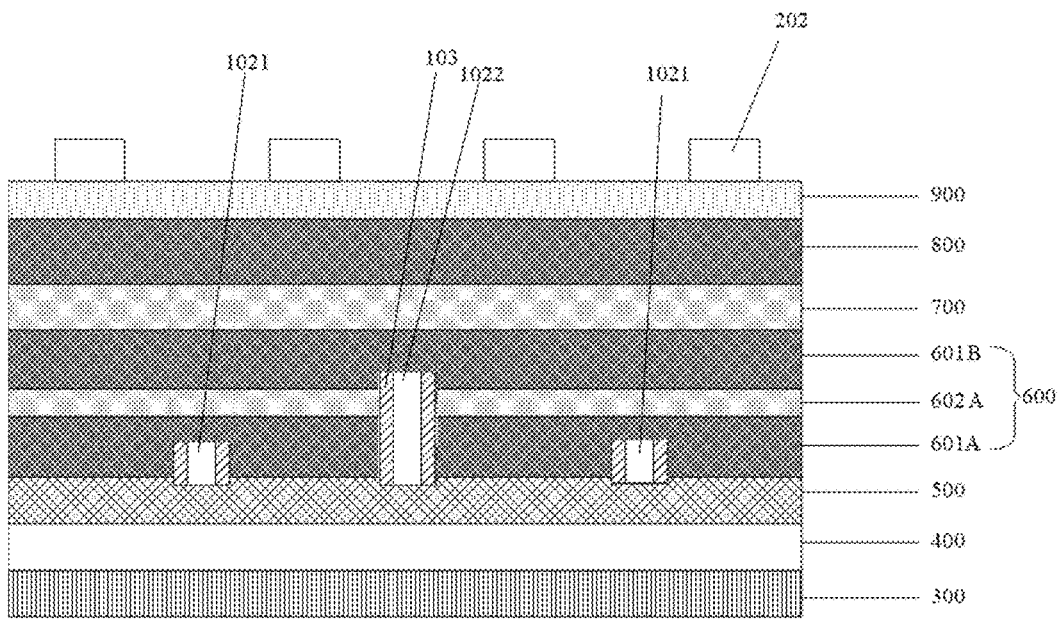
FIG. 8 is the cross-sectional view of an LED device according to another aspect of the present disclosure.

In another aspect of the present disclosure, as shown in FIG. 8, the first extended electrode 1021 may extend from the layer below the first conductive layer 600 and extend partially into the first conductive sub-layer 601A, allowing the first extended electrode 1021 to electrically contact the first conductive sub-layer 601A. The second extended electrode 1022 may also extend from the layer below the first conductive layer 600, through the first conductive sub-layer 601A and the current blocking layer 602A, and extend partially into the second conductive sub-layer 601B, allowing the second extended electrode 1022 to electrically contact the second conductive sub-layer 601B. The layer below the first conductive layer 600 may be the unintentional doped 500 which can be used as a conductive layer. Alternatively, an additional conductive layer may be added between the first conductive layer 600 and the unintentional doped 500.

In another aspect of the present disclosure, as shown in FIG. 5, the LED device may further comprise a transparent conductive layer 900 and a second electrode 202 on the transparent conductive layer 900. The second electrode 202 comprises a plurality of sub-electrodes in electrical contact with the second conductive layer 800 through the transparent conductive layer 900.

In addition, the first channel may extend through the transparent conductive layer 900, the second conductive layer 800, the active layer 700, the second conductive sub-layer 601B and the current blocking layer 602A, allowing the first extended electrode 1021 to electrically contact the first conductive sub-layer 601A through the first channel. The first channel may further comprise a first insulating structure which insulates the first extended electrode 1021 from the transparent conductive layer 900, the second conductive layer 800, the active layer 700, the second conductive sub-layer 601B and the current blocking layer 602A. The second channel may extend through the transparent conductive layer 900, the second conductive layer 800 and the active layer 700, allowing the second extended electrode 1022 to electrically contact the second conductive sub-layer 601B through the second channel. The second channel may further comprise a second insulating structure 103 which insulates the second extended electrode 1022 from the transparent conductive layer 900, the second conductive layer 800 and the active layer 700.

Alternatively or additionally, the insulating structure is formed of silicon dioxide; the first conductive layer 601, the active layer 700, and the second conductive layer 800 are formed with Metal Organic Chemical Vapor Deposition (MOCVD); the first channel and the second channel are formed with Inductively Coupled Plasma (ICP); and the transparent conductive layer 900 is formed with Physical Vapor Deposition (PVD).

Figure 6:
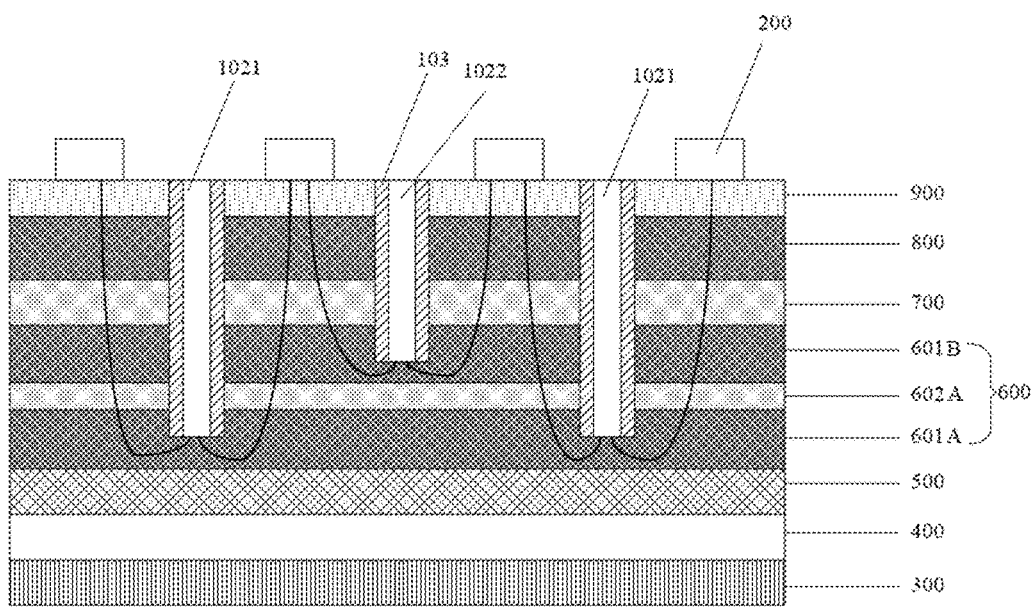
FIG. 6 is the schematic view of the current spreading of the LED device in FIG. 5.

As shown in FIG. 6, the first extended electrode 1021 of the first electrode electrically contacts one sub-layer of the first conductive layer, and the second extend electrode 1022 of the first electrode electrically contacts another sub-layer of the first conductive layer. In some aspects, a plurality of first extended electrodes 1021 and a plurality of second extended electrodes 1022 may be provided. Since the first and second extended electrodes electrically contact different sub-layers of the first conductive layer which are at different depths, the current flowing out from the first or the second extended electrodes of the first electrode is provided with a wider range to spread. This facilitates the current flow toward the second electrode 200 adjacent to the first and second extended electrodes, and thus minimizing the current crowding, and improving the lighting efficiency of the LED.

Figure 9:
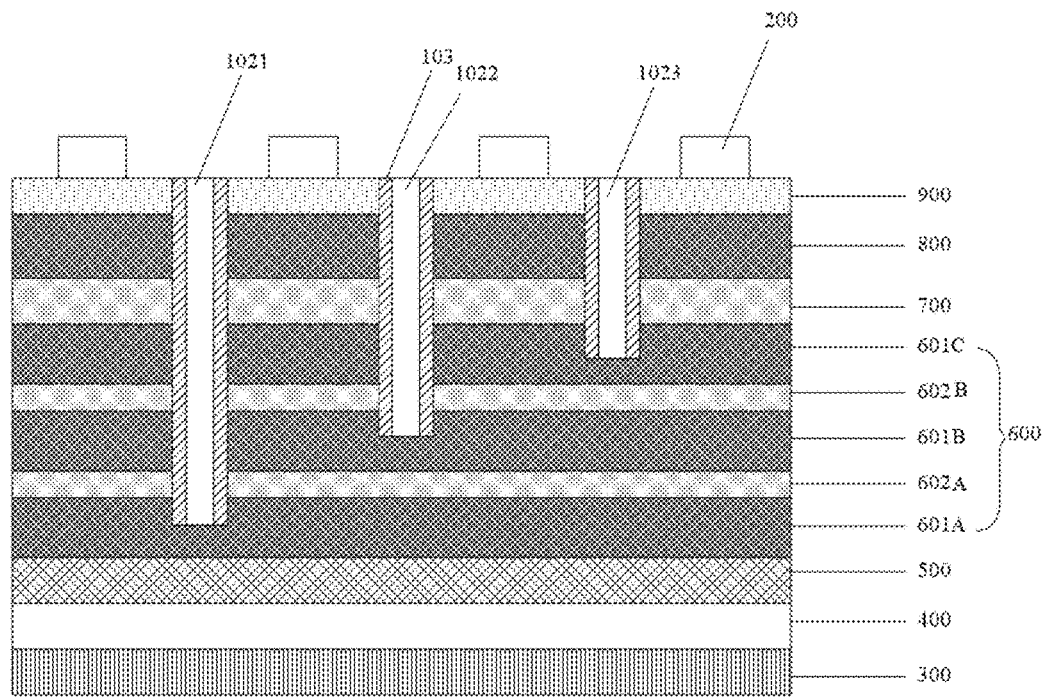
FIG. 9 is the cross-sectional view of an LED device according to another aspect of the present disclosure.

In another aspect of the present disclosure, as shown in FIG. 9, the first conductive layer 600 may further comprise a second current blocking 602B and a third conductive sub-layer 601C. The first electrode 102 further comprises a third extended electrode 1023 which is in electrical contact with the third conductive sub-layer 601C. The first conductive layer 600 may further comprise a third channel allowing the third extended electrode 1023 to electrically contact the third conductive sub-layer 601C. Alternatively or additionally, the third channel may extend partially into the third conductive sub-layer 601C.

Figure 10:
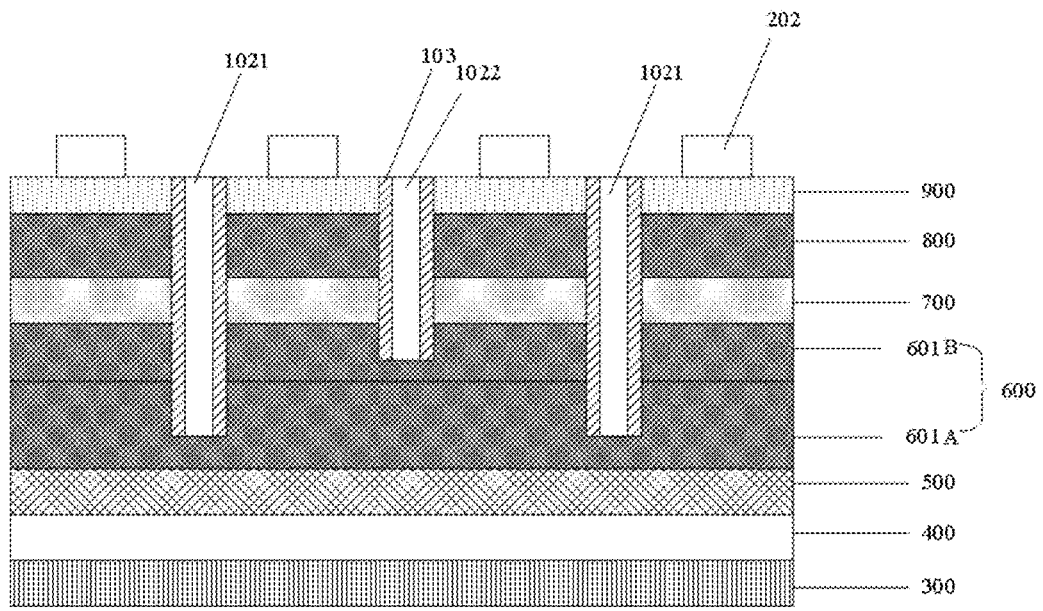
FIG. 10 is the cross-sectional view of an LED device according to another aspect of the present disclosure.

In another aspect of the present disclosure, in accordance with FIG. 10, an LED device comprises a first conductive layer 600, a second conductive layer 800, an active layer 700, and a first electrode 102. The active layer 700 is sandwiched between the first conductive layer 600 and the second conductive layer 800. The first electrode 102 is in electrical contact with the first conductive layer 600. The first conductive layer 600 comprises a first conductive sub-layer 601A and a second conductive sub-layer 601B at different depths. The first electrode 102 comprises a first extended electrode 1021 and a second extended electrode 1022, wherein the first extended electrode 1021 is in electrical contact with the first conductive sub-layer 601A at a first depth and the second extended electrode 1022 is in electrical contact with the second conductive sub-layer 601B at a second depth.

Figure 11:
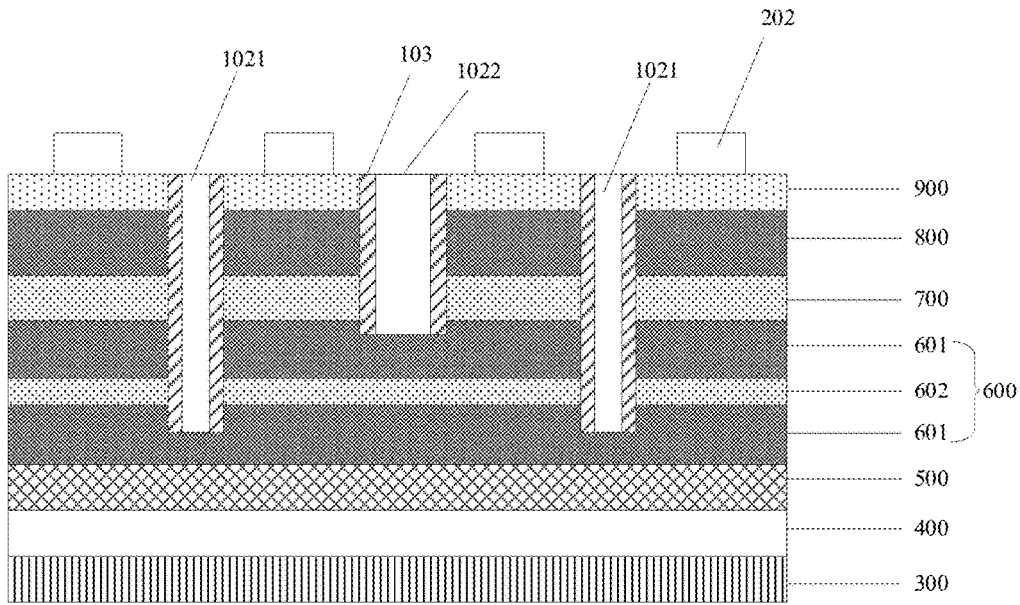
FIG. 11 is the cross-sectional view of an LED device according to another aspect of the present disclosure.

FIG. 11 is the cross-sectional view of an LED device according to another aspect of the present disclosure. Here, the second extended electrode 1022 may have a different width from the first extended electrode 1021. The width of the second extended electrode 1022 is greater than the width of the first extended electrode 1021.

The first conductive sub-layer 601A and the second conductive sub-layer 601B may further have different conductivities. Alternatively or additionally, the first conductive sub-layer 601A and the second conductive sub-layer 601B may be semiconductor materials doped differently.

The LED device may further comprise a current blocking layer 602A between the first conductive sub-layer 601A and the second conductive sub-layer 601B. The first conductive layer 600 may comprise a first channel extending through the second conductive sub-layer 601B and the current blocking layer 602A, allowing the first extended electrode 1021 to electrically contact the first conductive sub-layer 601A. The first conductive layer 600 may further comprise a second channel allowing the second extended electrode 1022 to be in electrical contact with the second conductive sub-layer 601B. Alternatively or additionally, the second channel extends partially into the second conductive sub-layer 601B.

Figure 12:
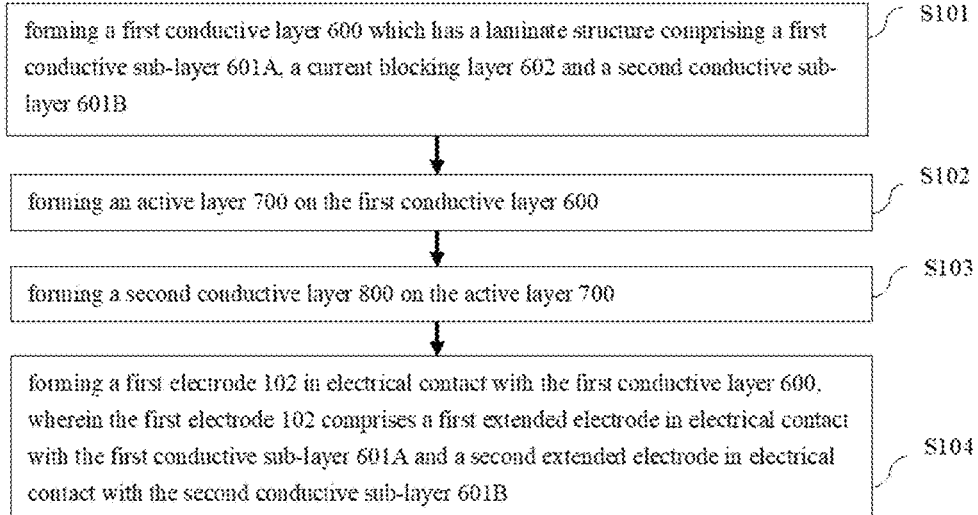
FIG. 12 is an exemplary flow chart illustrating a method for producing an LED device according to one aspect of the present disclosure.

Moreover, a method of producing the LED device in accordance with the present disclosure will be introduced and detailed with reference to FIGS. 12-14. As shown in FIG. 12, the method comprises the following steps:

S101: forming a first conductive layer 600 which has a laminate structure comprising a first conductive sub-layer 601A, a current blocking layer 602 and a second conductive sub-layer 601B;

S102: forming an active layer 700 on the first conductive layer 600;

S103: forming a second conductive layer 800 on the active layer 700; and S104: forming a first electrode 102 in electrical contact with the first conductive layer 600, wherein the first electrode 102 comprises a first extended electrode in electrical contact with the first conductive sub-layer 601A and a second extended electrode in electrical contact with the second conductive sub-layer 601B.

The method may further comprise forming a plurality of the first extended electrodes 1021 and a plurality of the second extended electrodes 1022. The first extended electrodes 1021 and the second extended electrodes 1022 may be arranged in an interlaced arrangement as shown in FIG. 5. Alternatively, the first extended electrodes 1021 may be arranged in an adjacent arrangement as shown in FIG. 7. The numbers of the first extended electrodes 1021 and the second extended electrodes 1022 are not limited to the indication in the aspect shown in FIG. 5. There will be at least one extended electrode in electrical contact with each conductive sub-layer.

The method may further comprise the step of forming a first channel through the second conductive sub-layer 601B and the current blocking layer 602A, allowing the first extended electrode 1021 to electrically contact the first conductive sub-layer 601A. Alternatively or additionally, the first channel may extend partially into the first conductive sub-layer 601A. The method may further comprise the step of forming a second channel which allows the second extended electrode 1022 to electrically contact the second conductive sub-layer 601B. Alternatively or additionally, the second channel may extend partially into the first conductive sub-layer 601A.

The method may further comprise the step of forming an insulating structure in the first channel which insulates the first extended electrode 1021 from the second conductive sub-layer 601B and the current blocking layer 602A.

In another aspect of the present disclosure, the first conductive layer 600 may further comprise a second current blocking layer 602B and a third conductive sub-layer 601C, and the first electrode 102 may further comprise a third extended electrode 1023 which is in electrical contact with the third conductive sub-layer 601C.

Figure 13:
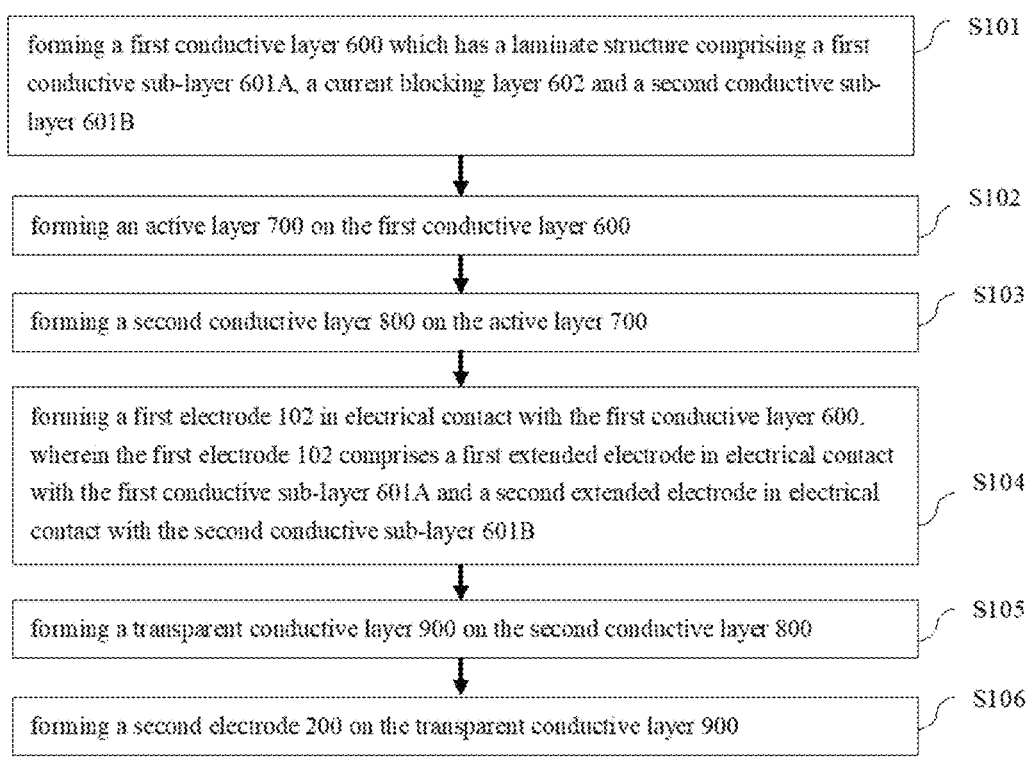
FIG. 13 is an exemplary flow chart illustrating a method for producing an LED device according to another aspect of the present disclosure.

In another aspect of the present disclosure, the method may further comprise the following steps as shown in FIG. 13:

S105: forming a transparent conductive layer 900 on the second conductive layer 800; and S106: forming a second electrode 200 on the transparent conductive layer 900.

The second electrode 200 may further comprise a plurality of sub-electrodes, each of which is in electrical contact with the second conductive layer 800 through the transparent conductive layer 900.

Figure 14:
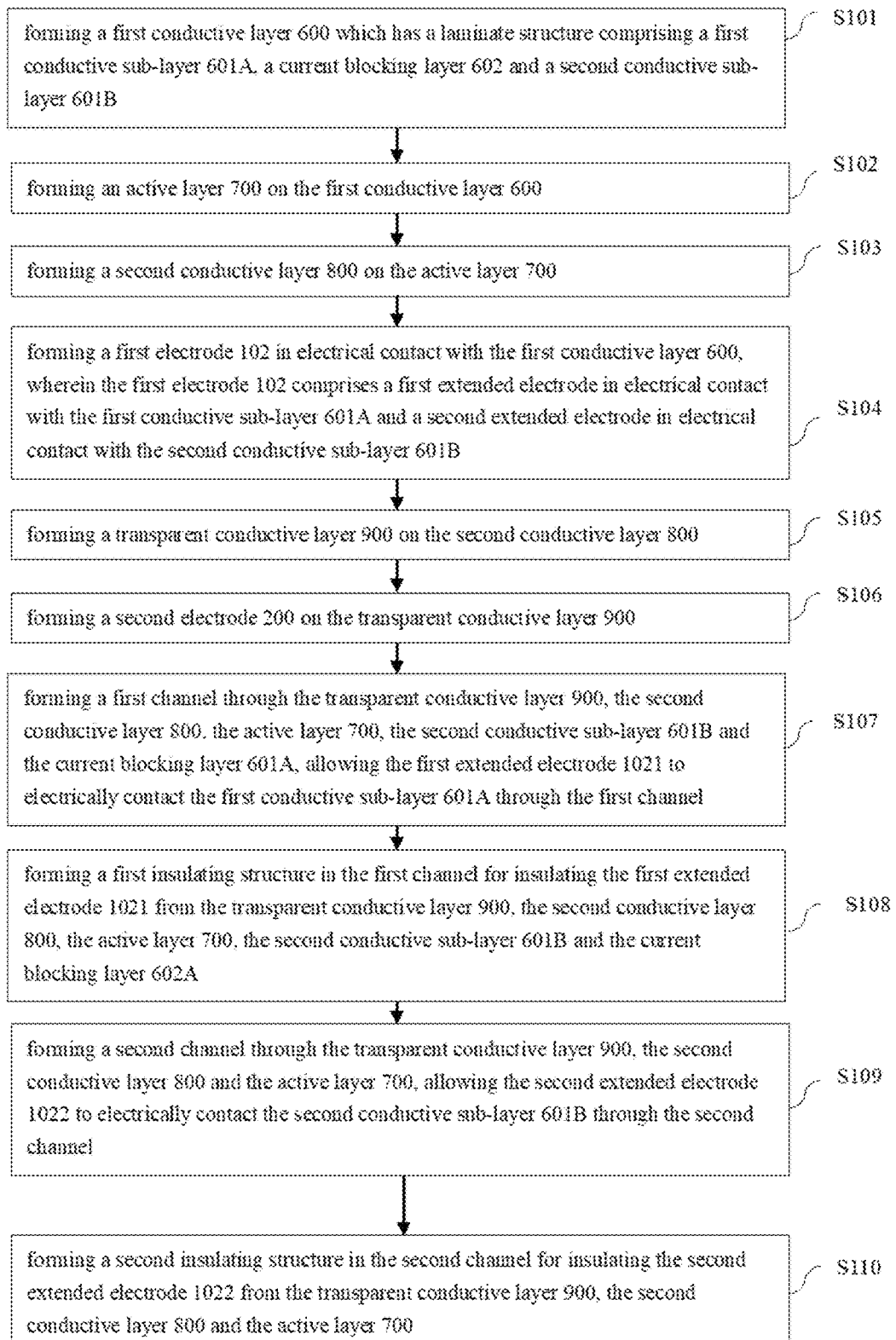
FIG. 14 is an exemplary flow chart illustrating a method for producing an LED device according to another aspect of the present disclosure.

In this aspect of the present disclosure, the method may further comprise the following steps as shown in FIG. 14:

S107: forming a first channel through the transparent conductive layer 900, the second conductive layer 800, the active layer 700, the second conductive sub-layer 601B and the current blocking layer 602A, allowing the first extended electrode 1021 to electrically contact the first conductive sub-layer 601A through the first channel;

S108: forming a first insulating structure in the first channel for insulating the first extended electrode 1021 from the transparent conductive layer 900, the second conductive layer 800, the active layer 700, the second conductive sub-layer 601B and the current blocking layer 602A;

S109: forming a second channel through the transparent conductive layer 900, the second conductive layer 800 and the active layer 700, allowing the second extended electrode 1022 to electrically contact the second conductive sub-layer 601B through the second channel; and S110: forming a second insulating structure in the second channel for insulating the second extended electrode 1022 from the transparent conductive layer 900, the second conductive layer 800 and the active layer 700.

The method may further comprise the step of forming a substrate 300, a buffer layer 400, and an unintentional doped layer 500, which are sequentially formed, and the first conductive layer 600 is subsequently formed thereon.

In one aspect, the insulating structure is formed of silicon dioxide; the buffer layer 400, the unintentional doped layer 500, the first conductive layer 600, the active layer 700, and the second conductive layer 800 are formed with Metal Organic Chemical Vapor Deposition (MOCVD); the first channel and the second channel are formed with Inductively Coupled Plasma (ICP); and the transparent conductive layer is formed with Physical Vapor Deposition (PVD).

Other aspects of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact examples described above and illustrated in the accompanying drawings, and that various modifications and changes can be made without departing from the scope thereof. It is intended that the scope of the invention only be limited by the appended claims.

What is claimed is:

1. A light-emitting diode device, comprising:
   a first conductive layer;
   a second conductive layer;
   an active layer sandwiched between the first conductive layer and the second conductive layer; and
   a first electrode in electrical contact with the first conductive layer,
   wherein the first conductive layer has a laminate structure comprising a first conductive sub-layer, a current blocking layer, and a second conductive sub-layer; and
   wherein the first electrode comprises a first extended electrode in electrical contact with the first conductive sub-layer; and a second extended electrode in electrical contact with the second conductive sub-layer.

2. The light-emitting diode device of claim 1, wherein the first conductive layer has a first channel through the second conductive sub-layer and the current blocking layer, allowing the first extended electrode to electrically contact the first conductive sub-layer.

3. The light-emitting diode device of claim 2, further comprising an insulating structure in the first channel for insulating the first extended electrode from the second conductive sub-layer and the current blocking layer.

4. The light-emitting diode device of claim 2, wherein the first channel extends partially into the first conductive sub-layer; and wherein first conductive layer has a second channel extends partially into the second conductive sub-layer, allowing the second extended electrode to electrically contact the second conductive sub-layer.

5. The light-emitting diode device of claim 1, further comprising a plurality of the first extended electrodes and a plurality of the second extended electrodes, wherein the first extended electrodes and the second extended electrodes are arranged in an interlaced arrangement.

6. The light-emitting diode device of claim 1, wherein the first conductive layer further comprises a second current blocking layer and a third conductive sub-layer; and the first electrode further comprises a third extended electrode in electrical contact with the third conductive sub-layer.

7. The light-emitting diode device of claim 2, wherein the first channel further extends through the active layer and the second conductive layer, and having an opening on the second conductive layer.

8. The light-emitting diode device of claim 1, further comprising:
   a transparent conductive layer on the second conductive layer, and
   a second electrode on the transparent conductive layer, wherein the second electrode comprises a plurality of sub-electrodes, each sub-electrode in electrical contact with the second conductive layer through the transparent conductive layer.

9. The light-emitting diode device of claim 8, further comprising:
a first channel through the transparent conductive layer, the second conductive layer, the active layer, the second conductive sub-layer, and the current blocking layer, allowing the first extended electrode to electrically contact the first conductive sub-layer through the first channel;
a first insulating structure in the first channel for insulating the first extended electrode from the transparent conductive layer, the second conductive layer, the active layer, the second conductive sub-layer, and the current blocking layer;
a second channel through the transparent conductive layer, the second conductive layer, and the active layer, allowing the second extended electrode to electrically contact the second conductive sub-layer through the second channel; and
a second insulating structure in the second channel for insulating the second extended electrode from the transparent conductive layer, the second conductive layer, and the active layer.

10. A method of producing a light-emitting diode, comprising:
forming a first conductive layer;
forming an active layer on the first conductive layer;
forming a second conductive layer on the active layer; and
forming a first electrode in electrical contact with the first conductive layer,
wherein the first conductive layer has a laminate structure comprising a first conductive sub-layer, a current blocking layer, and a second conductive sub-layer; and
wherein the first electrode comprises a first extended electrode in electrical contact with the first conductive sub-layer; and a second extended electrode in electrical contact with the second conductive sub-layer.

11. The method of claim 10, further comprising forming a first channel through the second conductive sub-layer and the current blocking layer, allowing the first extended electrode to electrically contact the first conductive sub-layer.

12. The method of claim 11, further comprising forming an insulating structure in the first channel for insulating the first extended electrode from the second conductive sub-layer and the current blocking layer.

13. The method of claim 11, wherein the first channel extends partially into the first conductive sub-layer; and wherein the method further comprises forming a second channel extending partially into the second conductive sub-layer, allowing the second extended electrode to electrically contact the second conductive sub-layer.

14. The method of claim 10, wherein the first conductive layer further comprises a second current blocking layer and a third conductive sub-layer; and the first electrode further comprises a third extended electrode in electrical contact with the third conductive sub-layer.

15. The method of claim 10, further comprising:
forming a transparent conductive layer on the second conductive layer; and
forming a second electrode on the transparent conductive layer;
wherein the second electrode comprising a plurality of sub-electrodes, each sub-electrode in electrical contact with the second conductive layer through the transparent conductive layer.

16. The method of claim 15, further comprising:
forming a first channel through the transparent conductive layer, the second conductive layer, the active layer, the second conductive sub-layer, and the current blocking layer, allowing the first extended electrode to electrically contact the first conductive sub-layer through the first channel;
forming a first insulating structure in the first channel for insulating the first extended electrode from the transparent conductive layer, the second conductive layer, the active layer, the second conductive sub-layer, and the current blocking layer;
forming a second channel through the transparent conductive layer, the second conductive layer, and the active layer, allowing the second extended electrode to electrically contact the second conductive sub-layer through the second channel; and
forming a second insulating structure in the second channel for insulating the second extended electrode from the transparent conductive layer, the second conductive layer, and the active layer.

17. The method of claim 16, wherein:
the insulating structure is formed of silicon dioxide;
the first conductive layer, the active layer, and the second conductive layer are formed with Metal Organic Chemical Vapor Deposition (MOCVD);
the first channel and the second channel are formed with Inductively Coupled Plasma (ICP); and
the transparent conductive layer is formed with Physical Vapor Deposition (PVD).

18. A light-emitting diode device, comprising:
a first conductive layer;
a second conductive layer;
an active layer sandwiched between the first conductive layer and the second conductive layer; and
a first electrode in electrical contact with the first conductive layer,
wherein the first conductive layer comprises a first conductive sub-layer and a second conductive sub-layer at different depths; and
wherein the first electrode comprises a first extended electrode in electrical contact with the first conductive sub-layer at a first depth; and a second extended electrode in electrical contact with the second conductive sub-layer at a second depth.

19. The light-emitting diode device of claim 18, wherein the first conductive layer further comprises a current blocking layer between the first conductive sub-layer and the second conductive sub-layer; and
wherein the first conductive layer has a first channel through the second conductive sub-layer and the current blocking layer, allowing the first extended electrode to electrically contact the first conductive sub-layer.

20. The light-emitting diode device of claim 18, wherein the first conductive sub-layer and the second conductive sub-layer have different conductivities, and/or being differently doped with semiconductor materials.

* * * * *